(12) United States Patent
Murata et al.

(10) Patent No.: US 9,972,518 B2
(45) Date of Patent: May 15, 2018

(54) GAS PURGE DEVICE AND GAS PURGE METHOD

(71) Applicant: MURATA MACHINERY, LTD., Kyoto-shi, Kyoto (JP)

(72) Inventors: Masanao Murata, Mie (JP); Takashi Yamaji, Mie (JP)

(73) Assignee: MURATA MACHINERY, LTD., Kyoto (JP)

( * ) Notice: Subject to any disclaimer, the term of this patent is extended or adjusted under 35 U.S.C. 154(b) by 39 days.

(21) Appl. No.: 14/906,946

(22) PCT Filed: Jun. 2, 2014

(86) PCT No.: PCT/JP2014/064596
§ 371 (c)(1),
(2) Date: Jan. 22, 2016

(87) PCT Pub. No.: WO2015/025584
PCT Pub. Date: Feb. 26, 2015

(65) Prior Publication Data
US 2016/0172223 A1    Jun. 16, 2016

(30) Foreign Application Priority Data

Aug. 20, 2013  (JP) ................................ 2013-170320

(51) Int. Cl.
*H01L 21/673*    (2006.01)
*G03F 1/66*      (2012.01)

(52) U.S. Cl.
CPC .......... *H01L 21/67389* (2013.01); *G03F 1/66* (2013.01); *H01L 21/67393* (2013.01)

(58) Field of Classification Search
CPC ................... H01L 21/67389; H01L 21/67393; G03F 1/66
USPC ........................................................ 141/98
See application file for complete search history.

(56) References Cited

U.S. PATENT DOCUMENTS

| | | | | |
|---|---|---|---|---|
| 6,419,491 | B1 * | 7/2002 | Ricci .................... | A61C 8/0012 433/173 |
| 9,514,973 | B2 * | 12/2016 | Fukaya ............. | H01L 21/67772 |
| 2012/0309286 | A1 * | 12/2012 | Nakano ............. | H01L 21/67775 454/305 |

OTHER PUBLICATIONS

English translation of Official Communication issued in corresponding International Application PCT/JP2014/064596, dated Mar. 3, 2016.

* cited by examiner

*Primary Examiner* — Mary McManmon
*Assistant Examiner* — Andrew Schmid
(74) *Attorney, Agent, or Firm* — Keating & Bennett, LLP

(57) ABSTRACT

A gas inlet made of an elastic material is prevented from getting scratched by contact with a nozzle, and adhesion between the gas inlet and the nozzle is prevented. A container is positioned, and a purge gas is introduced from the nozzle into a gas inlet hole in the center of a circular bottom surface of the gas inlet provided on the bottom of the container. The nozzle has a planar top end surface having a size equal to or greater than that of the bottom surface of the gas inlet, and a nozzle hole in the center of the top end surface, and has a size equal to or smaller than that of the gas inlet hole. The top end surface is roughened or includes a lubricant so that the top end surface and the gas inlet are mutually slidable.

12 Claims, 3 Drawing Sheets

GAS PURGE DEVICE AND GAS PURGE METHOD

BACKGROUND OF THE INVENTION

1. Field of the Invention

The present invention relates to gas purge of a container in which semiconductor substrates or the like are accommodated.

2. Description of the Related Art

Articles such as semiconductor substrates or reticles are accommodated in a container such as a FOUP or a reticle pod, and the container is transported by a transporting device and is stored in a stocker, an automated warehouse, or the like. In this regard, a purge gas such as nitrogen gas or clean dry air is supplied from a nozzle into the container via a gas inlet part in order to prevent contamination and oxidation of the articles and the like. The gas inlet part is made of, for example, an elastic circular material and has a hole in the center. With respect to the supply of the purge gas, JP2012-248785 proposes introducing the purge gas into a container via a nozzle configured to move up and down with an air cylinder.

In JP2012-248785, the contact pressure between the nozzle and the gas inlet part is maintained in a substantially constant range due to the air pressure applied by the air cylinder. On the other hand, if a fixed nozzle is put in contact with the gas inlet part of the container, the contact pressure changes due to a variation in the weight of the container depending on, for example, the presence or absence of semiconductor substrates, a variation in the height of the gas inlet part, or the like. Furthermore, the increases in the sizes of the semiconductor substrates have increased the weights of the containers. Therefore, pressed marks of the nozzle often remain on the surface of the gas inlet part made of an elastic material, and the gas inlet part often gets scratched. If the gas inlet part gets the nozzle mark or the scratches caused by the nozzle, the purge gas may leak due to the nozzle mark or the scratches caused by the nozzle on the gas inlet part, when the container has been transported and is newly put in contact with another nozzle. Furthermore, the gas inlet part and the nozzle are sometimes caught by each other due to the nozzle mark or the scratch caused by the nozzle, the container is prevented from sliding, and this possibly causes a failure in positioning of the container.

SUMMARY OF THE INVENTION

Preferred embodiments of the present invention prevent a gas inlet of a container from receiving a nozzle mark or a scratch due to the pressure of a nozzle and also prevent the gas inlet from adhering to the nozzle.

A gas purge device according to a preferred embodiment of the present invention positions a container and includes a nozzle to introduce a purge gas into a gas inlet, made of an elastic material, provided on a bottom of the container, and provided with a circular bottom surface and a gas inlet hole in a center of the bottom surface, the nozzle is provided with a planar top end surface having a size equal to or greater than that of the bottom surface of the gas inlet and a nozzle hole located in a center of the top end surface and having a size equal to or smaller than that of the gas inlet hole of the container, and the top end surface is roughened or includes a lubricant and supports the gas inlet slidably.

Furthermore, a gas purge method according to another preferred embodiment of the present invention positions a container and introduces a purge gas from a nozzle into a gas inlet, made of an elastic material, provided on a bottom of the container, and provided with a circular bottom surface and a gas inlet hole in a center of the bottom surface, the nozzle includes a planar top end surface having a size equal to or greater than that of the bottom surface of the gas inlet, and a nozzle hole located in a center of the top end surface and having a size equal to or smaller than that of the gas inlet hole of the container, and the nozzle applies a contact pressure to an entire surface of the gas inlet except for the gas inlet hole, and the top end surface is roughened or includes a lubricant and the gas inlet is made slidable with respect to the top end surface.

According to various preferred embodiments of the present invention, the nozzle has a planar top end surface having a size equal to or greater than that of the bottom surface of the gas inlet, and a nozzle hole located in a center of the top end surface and having a size equal to or smaller than that of the gas inlet hole of the container. Accordingly, the contact pressure with the nozzle is uniformly or substantially uniformly applied to the entire surface of the gas inlet, and thus the surface of the gas inlet made of an elastic material does not receive a nozzle mark or a scratch caused by the nozzle. This prevents leakage of the purge gas from the boundary between the nozzle and the gas inlet and improves the durability of the container.

If the gas inlet is in contact with a smooth top end surface of the nozzle over a large area, they may adhere to each other. This prevents positioning of the container and may cause a transfer error of the container in extreme cases. Furthermore, the positional accuracy of the container is low, and leakage of the purge gas may occur. In contrast thereto, when the top end surface is roughened, for example, by glass bead blasting, cutting work, or the like, the adhesion is not likely to occur. In this specification, the feature that the gas inlet is slidable indicates that the gas inlet may slide with respect to the nozzle due to a force exerted on the container at the time of positioning. The roughening makes the gas inlet and the top end surface slidable with each other. If a top end surface includes a lubricant, for example, a fluororesin such as Teflon (a registered trademark), instead of roughening, the adhesion is also prevented. In this specification, descriptions regarding the gas purge device are applicable to the gas purge method.

Preferably, the top end surface has a diameter equal to or greater than that of the gas inlet, and the nozzle hole has a diameter equal to or smaller than that of the gas inlet hole. Here, regarding a circular top end surface and a circular gas inlet, the diameters are those of the circles. When the top end surface and the gas inlet are, for example, square and are not circular, the sizes are the vertical or lateral sizes of the square shapes, the diagonal sizes, or the like. The feature that the top end surface has a diameter equal to or greater than that of the gas inlet indicates that, when they are overlapped concentrically one above the other, the gas inlet does not protrude to the outside from the top end surface. Furthermore, the feature that the nozzle hole has a diameter equal to or smaller than that of the gas inlet hole indicates that, when they are overlapped concentrically one above the other, the nozzle hole does not protrude from the gas inlet hole.

Preferably, the top end surface is arranged to be in contact with the entire surface of the gas inlet except for the gas inlet hole, to support the gas inlet, to apply a uniform or substantially uniform contact pressure from the nozzle to the entire surface of the gas inlet except for the gas inlet hole, to make the gas inlet slidable with respect to the top end surface, and to prevent adhesion between the gas inlet and the top end surface to accurately position of the container.

When the top end surface includes a lubricant, wearing of the lubricant may be caused. However, if the top end surface is roughened, then, the top end surface may be made of an antioxidative metal such as stainless-steel, and roughening, for example, by cutting work, glass bead blasting, or the like are usable on the surface. Therefore, the top end surface with roughening affords an improved durability compared with the top end surface that includes a lubricant. Accordingly, it is preferable that the top end surface is roughened, in order to lengthen the life of the nozzle.

More preferably, a gas purge device according to a preferred embodiment of the present invention further includes a rack support and positioning members provided on the rack support, the positioning members locate and position the container on the rack support, and the nozzle is fixed on the rack support at a fixed height so as not to move up and down. When gas purge devices are provided in a stocker, an automated warehouse, or the like, the number of the gas purge devices is large, and the fixed nozzles are advantageous. According to a preferred embodiment of the present invention, fixing the height of the nozzle does not cause the gas inlet to receive a nozzle mark or a scratch caused by the nozzle, and therefore a gas purge device according to a preferred embodiment of the present invention is appropriate for use in a stocker, an automated warehouse, or the like.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
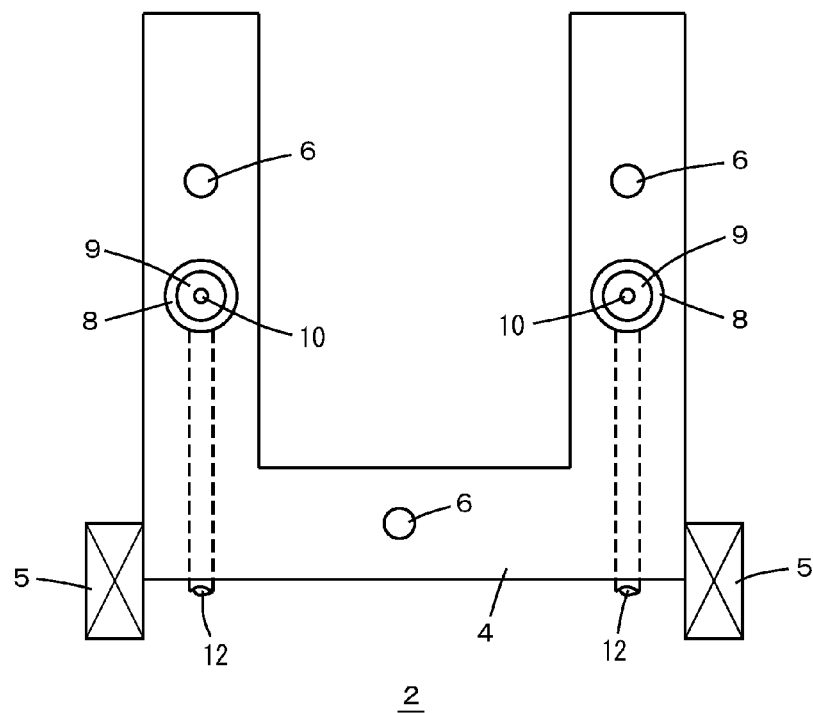
FIG. 1 is a plan view illustrating a gas purge device according to a preferred embodiment of the present invention.

Hereinafter, preferred embodiments of the present invention will be described. The scope of the present invention should be construed according to the understanding of a person skilled in the art based on the claims, in view of the description of the specification and well known techniques in this field.

FIGS. 1 to 7 illustrate various preferred embodiments of the present invention. Gas purge devices 2 are provided in, for example, a stocker or an automated warehouse, and position and store containers in which semiconductor substrates, reticles, or the like are accommodated and to introduce a purge gas into the containers. The reference numeral 4 denotes a rack support supported by supporting pillars 5 of the stocker. For example, three pins 6 defining the positioning members protrude from the rack support 4 and are able to be kinematically coupled with positioning grooves of the container to position the container. The reference numeral 8 denotes a nozzle to introduce a purge gas, and one or two nozzles are provided so as to protrude upward from the rack support 4. The nozzle 8 includes, in its top end, a circular top end surface 9 with a circular nozzle hole 10 in the center thereof. Furthermore, the material of the nozzle 8 is, for example, a durable stainless-steel, and a pipe 12 that supplies the purge gas is connected to the nozzle 8. The nozzle 8 is fixed to the rack support 4, neither moves up nor down, and neither slides in the horizontal direction.

Figure 2:
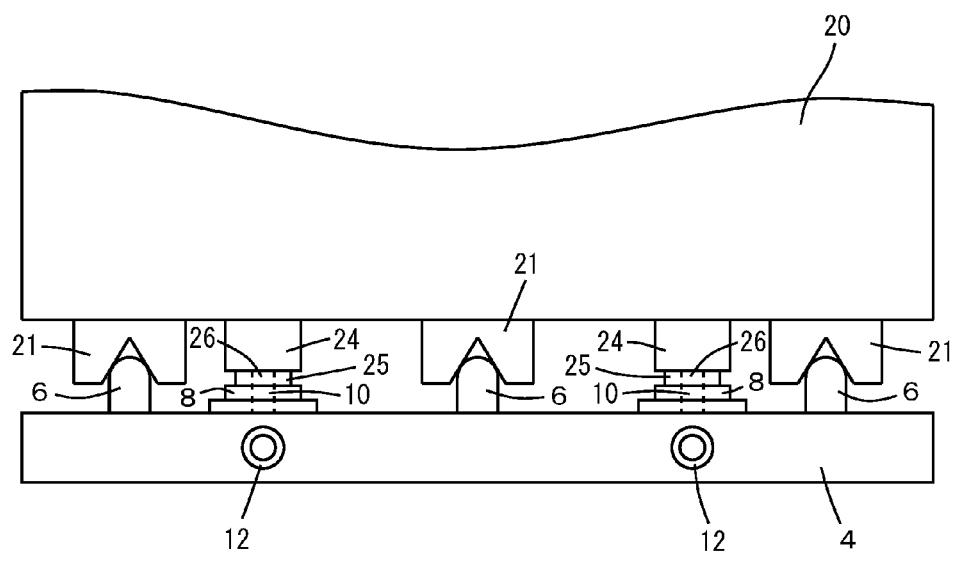
FIG. 2 is a front view illustrating main portions of a container and the gas purge device.

As shown in FIG. 2, on the bottom of a container 20 is provided three groove members 21 located at or substantially at the vertices of an equilateral triangle in a plan view on the bottom. With kinematical coupling to V-shaped grooves of the groove members 21, the three pins 6 of the gas purge device 2 position the container 20 with respect to the rack support 4. The bottom of the container 20 is provided with one or more support members 24 to the bottom of which a gas inlet 25 made of an elastic material is attached. When the container 20 is positioned with respect to the rack support 4, the nozzle 8 and the gas inlet 25 are aligned and a purge gas from the pipe 12 is introduced into the container 20.

Figure 3:
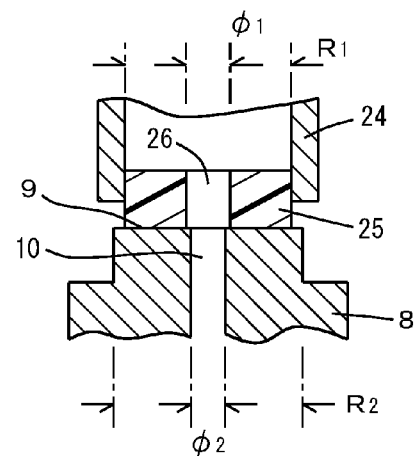
FIG. 3 is a cross-sectional view taken in a vertical direction illustrating main portions of a gas inlet of the container and a nozzle of the gas purge device.

FIG. 3 illustrates the contact between the nozzle 8 and the gas inlet 25, the material of the nozzle 8 is, for example, a stainless-steel. The top end surface 9 is planar and circular in a plan view, and is provided with the nozzle hole 10 in the center thereof. Furthermore, the gas inlet 25 is made of a gasket rubber or the like, circular when viewed from the bottom, and includes a gas inlet hole 26 in the center thereof. The top end surface 9 has an outer diameter R2 equal to or greater than an outer diameter R1 of the gas inlet 25, and the nozzle 1 has a diameter $\phi 2$ equal to or smaller than a diameter $\phi 1$ of the gas inlet hole 26, so that the entire surface of the gas inlet 25 except for the gas inlet hole is put in contact with the top end surface 9. When the outer edge of the gas inlet is chamfered, the outer diameter of the top end surface of the nozzle is made equal to or greater than the outer diameter of the flat portion of the gas inlet. As a result, the entire surface of the gas inlet 25 is put in contact with the top end surface 9, uniform or substantially uniform pressure is applied to the gas inlet 25, and thus, when the container 20 is stored on the rack support 4 for a long period, the gas inlet 25 does not receive any nozzle mark or any scratch caused by the nozzle. Conventionally, top end surfaces are preferably in the shape of a ring, instead of a circle, or the shape of a circle whose outer diameter is smaller than the outer diameter of the gas inlet, and thus the gas inlet 25 may receive a mark of a nozzle or a scratch caused by the nozzle.

Figure 4:
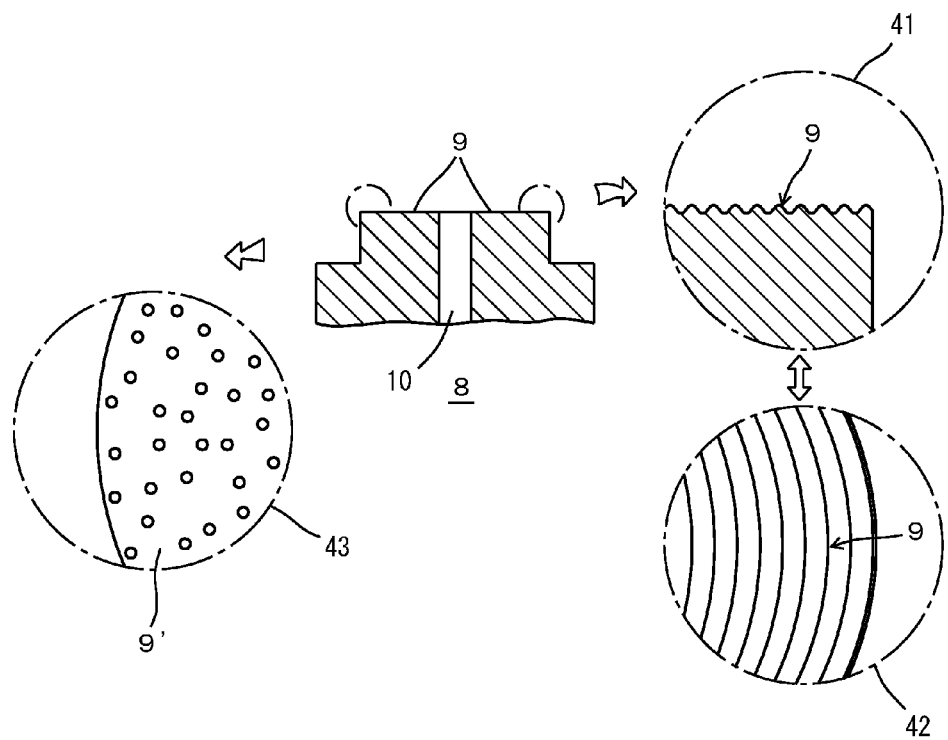
FIG. 4 is a cross-sectional view taken in a vertical direction illustrating the main portion of the nozzle, with a surface-treated top end of the nozzle shown enlarged in circles with a dashed-dotted line.

The gas inlet 25 is made of an elastic material, the top end surface 9 is a planar surface, and the contact area between them is large. Therefore, the gas inlet 25 and the top end surface 9 may adhere to each other. For avoiding the adhesion, the top end surface 9 is provided with recesses and projections in an area 41 enclosed by a dashed-dotted line in a vertical cross-sectional view and in an area 42 enclosed by a dashed-dotted line in a plan view as is shown in FIG. 4. Their shapes are, for example, circular or spiral. The recesses and projections have a height/depth of, for example, on the order of several tens of micrometers, and are easily formed by cutting work or the like. Roughening the top end surface 9 prevents the adhesion to the gas inlet 25.

Figure 5:
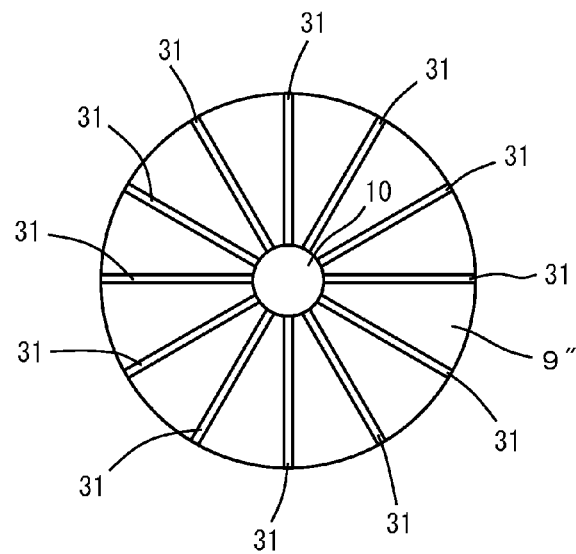
FIG. 5 is a plan view illustrating a top end of a nozzle according to a comparative example.

Alternatively, as a flat surface 9' shown in an area 43 with a dashed-dotted line in the lower left portion of FIG. 4, roughening of the surface with glass bead blasting or the like may be performed. Also in this case, recesses and projections of the roughened surface are of the order of several tens of micrometers to several hundreds of micrometers, for example. Radial grooves 31 in a top end surface 9" in FIG. 5 are not preferable because they may cause leakage of a purge gas.

Figure 6:
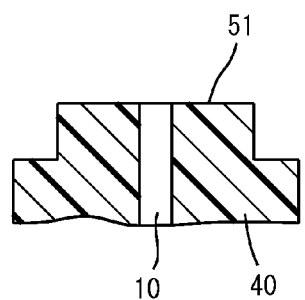
FIG. 6 is a cross-sectional view taken in a vertical direction illustrating a main portion of a nozzle according to a modification of a preferred embodiment of the present invention.
Figure 7:
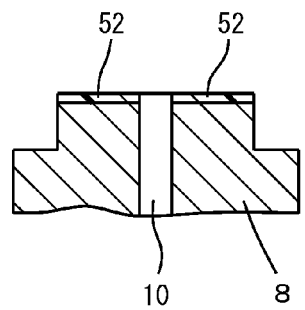
FIG. 7 is a cross-sectional view taken in a vertical direction illustrating a main portion of a nozzle according to another modification of a preferred embodiment of the present invention.

The top end surface may include a lubricant, instead of being roughened, for example. A nozzle 40 of FIG. 6 is made of a fluororesin (for example, Teflon (a registered trademark)), and the reference numeral 51 denotes a top end surface. In FIG. 7, a lubricant coating 52 made of Teflon (a registered trademark) is preferably provided on the top end surface of the stainless-steel nozzle 8. The modifications of FIGS. 6 and 7 are the same as the preferred embodiment of FIGS. 1 to 5 except that the top end surface includes a lubricant.

The gas purge device 2 may be further provided with, in addition to the nozzle 8 to introduce the purge gas, a nozzle to discharge the purge gas. In this case, similarly to the gas inlet 25, a gas outlet made of an elastic material and having a circular shape with an outlet hole in the center is provided on the container 20 and is to be put in contact with the discharge nozzle. In this case, it is preferable that the discharge nozzle have the same configuration as that of the nozzle 8 of the present preferred embodiment. Namely, it is preferable that the top end surface of the discharge nozzle has an outer diameter equal to or greater than an outer diameter of the gas outlet, and the outlet hole in the center of the discharge nozzle has a diameter equal to or smaller than a diameter of the outlet hole of the gas outlet. Moreover, it is preferable that the top end surface of the discharge nozzle is roughened or includes a lubricant.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A gas purge device positioning a container and comprising:
    a nozzle to introduce a purge gas into a gas inlet; wherein
    the gas inlet is made of an elastic material, provided on a bottom of the container, and provided with a circular bottom surface and a gas inlet hole in a center of the bottom surface;
    the nozzle is provided with a top end surface having a size equal to or greater than that of the bottom surface of the gas inlet, and a nozzle hole located in a center of the top end surface and having a size equal to or smaller than that of the gas inlet hole of the container;
    the top end surface is planar and protrudes upward from a top end of the nozzle such that the top end surface is an uppermost surface of the nozzle; and
    the top end surface includes a lubricant or is roughened by bead blasting or cutting, and supports the gas inlet slidably.

2. The gas purge device according to claim 1, wherein the top end surface has a diameter equal to or greater than that of the gas inlet, and the nozzle hole has a diameter equal to or smaller than that of the gas inlet hole.

3. The gas purge device according to claim 2, wherein the top end surface contacts an entire surface of the gas inlet except for the gas inlet hole, to support the gas inlet, to apply a uniform or substantially uniform contact pressure from the nozzle to an entire surface of the gas inlet except for the gas inlet hole, to make the gas inlet slidable with respect to the top end surface, and to prevent adhesion between the gas inlet and the top end surface when positioning the container.

4. The gas purge device according to claim 1, wherein the top end surface is roughened.

5. The gas purge device according to claim 1, further comprising:
    a rack support; and
    positioning members provided on the rack support; wherein
    the positioning members position the container on the rack support; and
    the nozzle is fixed on the rack support at a fixed height so as not to move up and down.

6. A gas purge method comprising positioning a container and introducing a purge gas from a nozzle into a gas inlet, wherein
    the gas inlet is made of an elastic material, provided on a bottom of the container, and provided with a circular bottom surface and a gas inlet hole in a center of the bottom surface;
    the nozzle has a top end surface having a size equal to or greater than that of the bottom surface of the gas inlet, and a nozzle hole located in a center of the top end surface and having a size equal to or smaller than that of the gas inlet hole of the container;
    the nozzle applies a contact pressure to an entire surface of the gas inlet except for the gas inlet hole;
    the top end surface is planar and protrudes upward from a top end of the nozzle such that the top end surface is an uppermost surface of the nozzle;
    the top end surface includes a lubricant or is roughened by bead blasting or cutting; and
    the gas inlet is slidable with respect to the top end surface.

7. The gas purge method according to claim 6, wherein
    the top end surface contacts with an entire surface of the gas inlet except for the gas inlet hole and applies a uniform or substantially uniform contact pressure from the nozzle to the entire surface of the gas inlet except for the gas inlet hole, and prevents application of a mark and a scratch on the gas inlet; and
    adhesion between the gas inlet and the top end surface is prevented while positioning the container.

8. The gas purge device according to claim 4, wherein the top end surface roughening is defined by recesses and projections.

9. The gas purge device according to claim 8, wherein the recesses and the projections are arranged in a circular or spiral shape on the top end surface.

10. The gas purge device according to claim 9, wherein the top end surface is roughened by bead blasting.

11. The gas purge device according to claim 1, wherein the bottom surface of the gas inlet is made of the elastic material.

12. The gas purge device according to claim 1, wherein the elastic material of the gas inlet is rubber.

* * * * *